United States Patent [19]
Hess et al.
[11] Patent Number: 4,906,935
[45] Date of Patent: Mar. 6, 1990

[54] METHOD AND EQUIPMENT FOR VACUUM MONITORING IN VACUUM SWITCHING TUBES

[75] Inventors: Ruediger Hess, Berlin; Wilfried Kuhl, Wendelstein; Leonhard Klug, Erlangen; Wolfgang Schilling, Herzogenaurach; Peter Trentin, Gustavsburg; Heribert Weber, Frankfurt am Main; Wolfgang Schlenk, Erlangen; Heinz-Helmut Schramm, Berlin, all of Fed. Rep. of Germany

[73] Assignee: Siemens Aktiengesellschaft, Berlin & Munich, Fed. Rep. of Germany

[21] Appl. No.: 251,692

[22] Filed: Sep. 29, 1988

[30] Foreign Application Priority Data

Sep. 30, 1987 [DE] Fed. Rep. of Germany ....... 3733107
Dec. 23, 1987 [DE] Fed. Rep. of Germany ....... 3743868

[51] Int. Cl.⁴ ...................... G01R 31/25; G01L 21/00
[52] U.S. Cl. .................................. 324/409; 324/415; 324/460
[58] Field of Search ............... 324/424, 537, 555, 556, 324/460, 461, 405, 409, 407, 408, 410, 415; 340/600; 455/3

[56] References Cited

U.S. PATENT DOCUMENTS 4,000,457 12/1976 O'Neal, III ........................ 324/463
4,714,891 12/1987 Morrison, Jr. ...................... 324/500

*Primary Examiner*—Reinhard J. Eisenzopf
*Assistant Examiner*—Jack B. Harvey
*Attorney, Agent, or Firm*—Kenyon & Kenyon

[57] ABSTRACT

To check the presence of operating vacuum in vacuum switches, high voltage can be applied between the contacts at a given contact spacing and the dielectric strength can be tested. According to the invention, the procedure for vacuum monitoring is that a contact spacing (h) below the nominal stroke of the vacuum switch is selected and that the X-radiation generated at this contact spacing (h) and high voltage (U) in vacuum due to the field electron emission between the contacts by the contact surfaces acting as anode is acquired and evaluated as proof of the presence of operating vacuum inside the switching tube. This method can preferably be applied to encapsulated vacuum switching tubes, in particular to $SF_6$-insulated switching facilities. Associated with the vacuum switching tube (15) in the associated equipment is an X-ray detector, preferably a Geiger-Muller counter, which is connected to the high-voltage unit (25) via an evaluating circuit (30 to 50) which serves for the determination and indication of the operating vacuum and shuts off the high-voltage unit (25) to minimize the X-ray dose. Due to the X-ray emission, which is stopped long before reaching impermissible values, the presence of vacuum can be positively verified.

19 Claims, 3 Drawing Sheets

METHOD AND EQUIPMENT FOR VACUUM MONITORING IN VACUUM SWITCHING TUBES

BACKGROUND OF THE INVENTION a. Field of the Invention

The invention relates to a method for vacuum monitoring in vacuum switching tubes in which high voltage is applied between the contacts having a preselected contact spacing. In addition, the invention relates to the associated equipment for the implementation of the method, with a high voltage unit to generate a test voltage for the vacuum switching tube switching contacts opened at a defined contact stroke.

b. Description of the Prior Art

Vacuum switching tubes are used in insulated switching facilities, and other similar installations. Vacuum switching tubes are usually tested before delivery, using a setup based on the magnetron test principle. Due to modern production technology, a vacuum loss in the switching tube cannot occur in the normal case even after a long time period. It is required, nevertheless, to be able to check the internal pressure of a vacuum switch installed in the switching facility without having to disassemble the switching tube from its container.

For switching tubes without $SF_6$ insulation, the user can check the internal pressure reliably by using mobile measuring instruments, e.g., measuring methods using the high-voltage testing modified magnetron apparatus with permanent magnets. Such known methods and measuring instruments cannot be applied to vacuum switching tubes installed in $SF_6$ insulated switching facilities. In the hitherto commonly used high-voltage test in particular, the good insulation of $SF_6$ would maintain the test voltage, and thus simulate a good vacuum, despite a possible leak in the switching tube during a test pulse. Therefore, this method is unable to distinguish reliably between vacuum and $SF_6$, i.e., a leak in the switching tube.

OBJECTIVES AND SUMMARY OF THE INVENTION

Accordingly, it is an objective of the invention to provide a method and associated equipment with which it can be determined whether an operating vacuum is present in the vacuum switching tube and which are applicable to unencapsulated and encapsulated switching tubes alike.

According to the invention, the problem is solved by the following features:

(a) A contact spacing shorter than the nominal stroke of the vacuum switch is selected, (b) X-rays are generated at this contact spacing in vacuum due to the field electron emission between the contacts by the contact surfaces acting as anode, and the X-rays are (c) evaluated as proof of the presence of operating vacuum in the switching tube.

In the associated equipment for the implementation of this method, an x-ray detector, preferably a Geiger-Muller counter, is associated with the vacuum switching tube, which detector is connected to the high-voltage unit via an evaluating circuit. The evaluating circuit determines and displays the presence of operating vacuum or a leak and shuts off the high voltage unit to minimize the x-ray dose.

The invention can preferably be applied to encapsulated vacuum switch tubes, in particular to $SF_6$ insulated switching facilities in order to determine whether, specifically, any insulating gas has leaked into the interior of the tube, without having to remove the switching tubes from the $SF_6$ enclosure.

In other words, a modified high-voltage unit in combination with an X-radiation measuring instrument and a corresponding signal evaluating circuit is used for the vacuum check within the scope of the invention. The x-radiation automatically generated in a high-voltage test, specifically at a reduced switch contact spacing compared to the normal stroke, is utilized.

The principle of measuring x-ray emissions of the contact surfaces at normal spacing is known. For example, U.S. Pat. No. 4,534,741 and the Japanese Disclosure 60-49520 describe in detail that the x-radiation emitted by field electron emission between the contacts of mutually opposite contact surfaces can be utilized. But this involves exclusively the testing of the dielectric properties of the contact surfaces, the presence of vacuum in the switching tube being assumed in this case. There is no relationship between these references and the teaching according to the invention to the effect of utilizing the x-ray emission as a detector specifically for the presence of operating vacuum and, in its absence, on the other hand, for the presence of leaks or gas flooding.

It is of particular advantage within the scope of the invention that while the x-ray emission can be utilized for the test puposes, the emission does not reach the impermissible limit specified in the radiation protection regulations.

BRIEF DESCRIPTION OF THE FIGURES

Other advantages and details of the invention follow from the discription below of the preferred embodiment and from the drawings wherein.

DETAILED DESCRIPTION OF THE INVENTION

In the figures, identical parts in different views of the various Figures have the same reference symbols.

Figure 1:
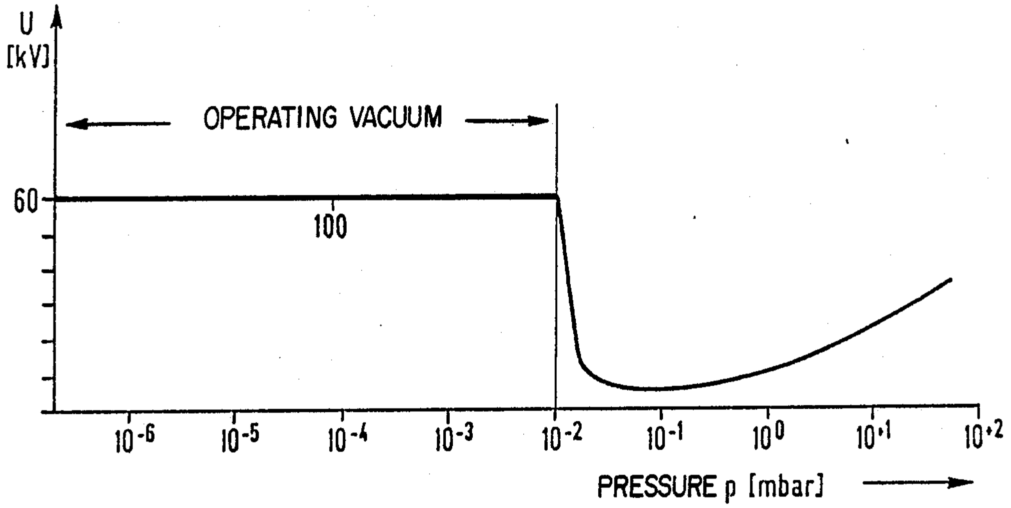
FIG. 1 is a graph showing the dielectric strength as a function of the logarithmically plotted pressure at a specified contact spacing.

In the diagram of FIG. 1, the abscissa gives the pressure of a vacuum switching tube in millibars and the ordinate shows the dielectric strength U in kilovolts DC. The resultant functional relation is the so-called Paschen curve which represents the respective maximum voltage between open switch contacts without flashover.

As is known, the dielectric strength in vacuum is very high and is dependent on the contact material. For example, for CuCr the dielectric strength is about 80 kV at 1 mm contact spacing. Leakage of air into the tube lowers the dielectric strength. As air pressure exceeds $10^{-2}$ mbar the dielectric strength drops steeply to the so-called Paschen minimum of a few 100 V. Toward atmospheric pressure (1000 mbar), the dielectric strength increases again to several kV.

A Paschen curve 100 is shown in FIG. 1 as parameter for a contact spacing of h=3 mm. The operating vacuum required for vacuum switching tube to function can be defined by the Paschen curve 100: generally, it must be less than $10^{-2}$ mbar. However, the exact pressure below this magnitude plays no decisive role for the dielectric strength.

It is known that when generating S-radiation by electron excitation, essentially the same requirements must be met by the vacuum. For this reason, the presence of X-ray emission can be utilized, especially in vacuum switching tubes, as a sensor for the presence of operating vacuum.

Vacuum switches usually have a nominal stroke between 10 and 20 mm. At this travel, no measurable X-ray emission occurs outside the vacuum switching tube. For test purposes, however, contact strokes below the nominal travel, particularly in the range between 1 and 8 mm, e.g. 3 mm, can be used in vacuum switches. The contact travel can be preset to this value through a spacer manually attachable to the external switch gear drive shaft.

At a contact spacing of 3 mm, the contact material of the contact pieces is excited to radiate X-rays due to field electron emission between the contact pieces, the X-radiation being measurable outside the vacuum switch. On the other hand, if the vacuum collapses, which can happen spontaneously due to a leak or due to slow flooding, no X-radiation occurs.

Figure 2:
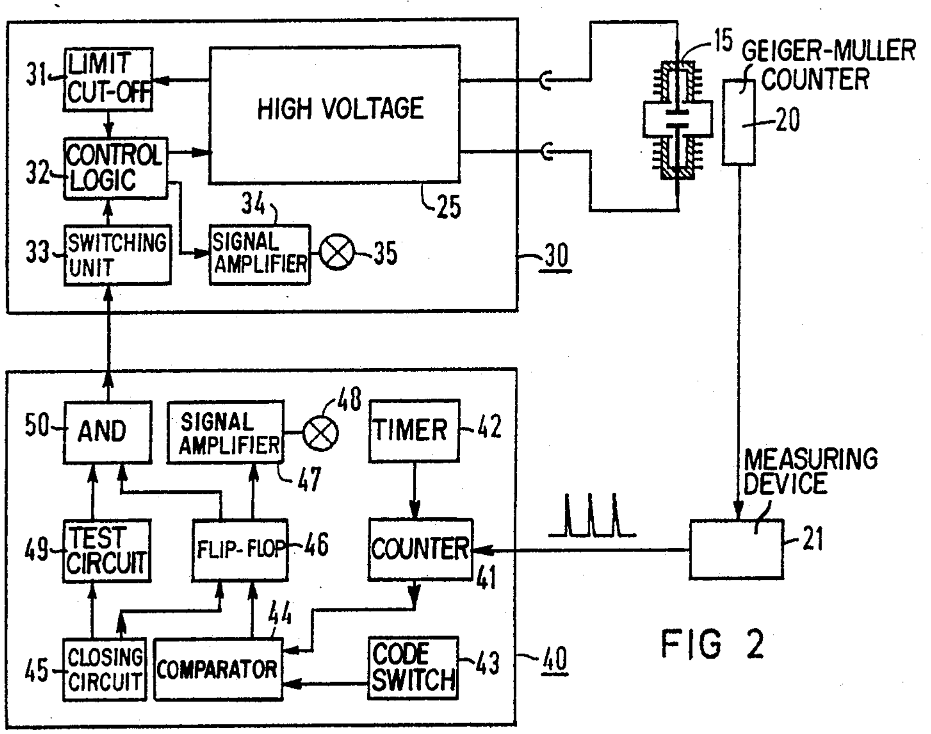
FIG. 2 shows a block diagram of an evaluating circuit for the test equipment constructed in accordance with the invention.

The X-radiation is acquired, for example, by the circuit shown in FIG. 2. In FIG. 2 are schematically shown a vacuum switching tube 15, a Geiger-Muller counter 20 associated with the tube and a subsequent measuring instrument 21.

The evaluating circuit, shown in the form of a block diagram, consists essentially of two units 30 and 40, their functional relationship being described in detail below.

Block 30 comprises a high-voltage unit 25 for the generation of the test voltage, with which is connected a limiting unit 31. A subsequent control logic 32 and a switching unit 33 turn the high-voltage unit 25 on and off. The control logic 32 drives an indicating device consisting of a signal amplifier 34 and a signal lamp 35.

The entire block 30 is connected via a signal line to the block 40 which also drives the unit 33. Block 40 comprises a counter 41 driven by the count pulses of the measuring instrument 21 which follows the Geiger-Muller counter 20. The pulses generated within a given time, which is settable by means of a timer 42, e.g., within a second, are added up in the counter 41. The count is fed to a comparator 44 and compared with a value specified by means of a coding switch 43. The response signal is fed to a flip-flop 46 also drivingly connected to a closing circuit 45.

The flip-flop 46 also drives an indicating device consisting of signal amplifier 47 and signal lamp 48 and an AND gate 50 actuated by the closing circuit 45 and a test timer 49 which limits the test duration to e.g., 30 sec.

The presence of operating vacuum in the switching tube 15 can be detected unequivocally by means of the above described evaluating circuit without the occurrence of impermissibly high X-ray emissions. Therefore, switching tubes defective due to vacuum loss can be reliably detected.

It has been found that the test for monitoring the presence of vacuum by X-ray emission should be limited to 30 sec., to which the test timer 49 is set. At these values the vacuum state of switching tubes can be checked for new as well as used contact surfaces. The sensitivity of the Geiger-Muller counter 20 is generally so high that an X-ray of as low as 1 $\mu$Sv is pick up. Since this value is within the zero effect range of the natural ambient radiation, it is generally regarded as safe to operate in this range.

When executing the method according to the invention it is useful to adjust the test voltage from a low value and gradually increase the same to the operating point, the evaluating circuit being in operation with increasing voltage.

Figure 3:
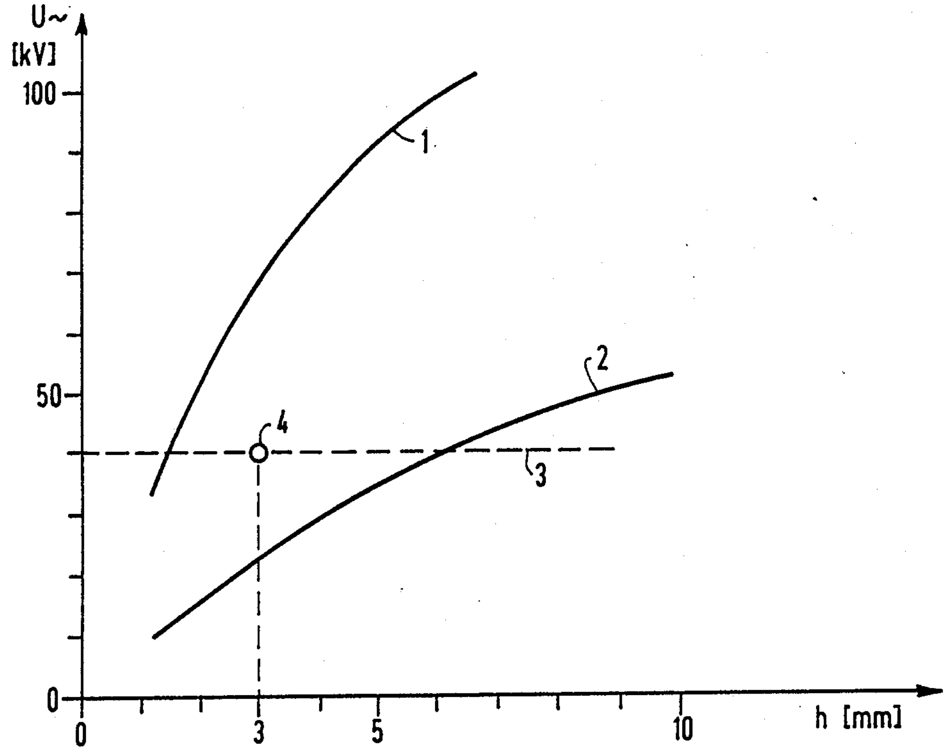
FIG. 3 shows a graph of the dielectric strength beteen vacuum switch contacts as a function of the contact spacing.

The diagram of FIG. 3 shows the contact spacing h in millimeters as abscissa and the dielectric strength in kilovolts AC on the ordinate. As is known, the dielectric strength is an exponentially rising function of the contact spacing. In FIG. 3 curve 1 indicates dielectric strength in vacuum as a parameter and curve 2 shows the dielectric strength in 1.5 bar $SF_6$. These curves mean that voltages below the determined curves are maintained whereas voltages above the curve cause flashover between the contacts.

The VDE specification specify an alternating test voltage for testing vacuum switching tubes. In practice, the common procedure is to test equipment which has been used for a while at values of 0.8 times the alternating test voltage of e.g. 40 kV. This limit is shown as a horizontal line 3 on FIG. 3. By specifying a certain contact spacing of e.g. 3 mm an operating point is now defined, designated 4 in the diagram of FIG. 3. This means that the test voltage is maintained under vacuum at this operating point while leading to a breakdown when there is flooding of $SF_6$ at 1.5 bar.

Figure 4:
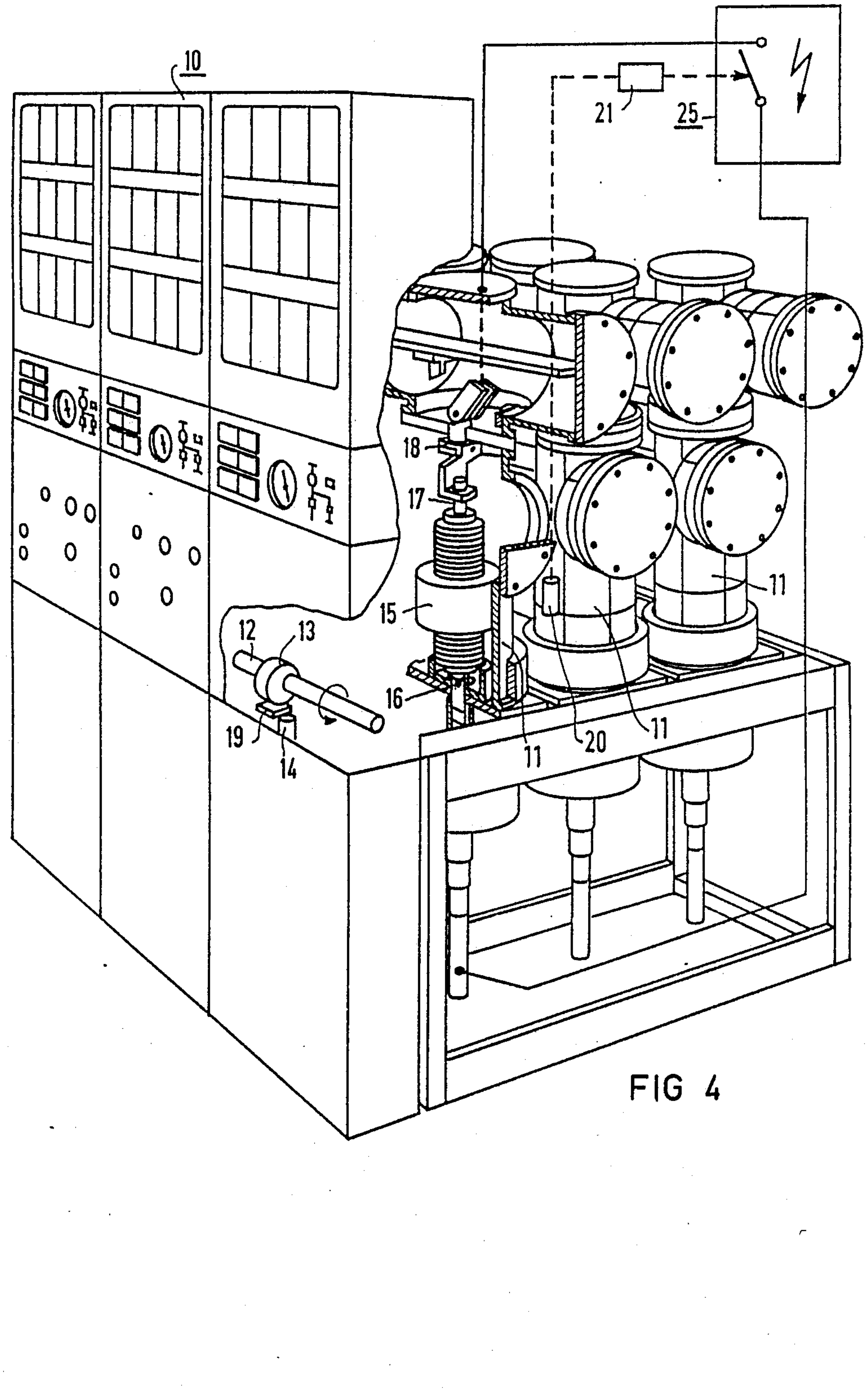
FIG. 4 shows a schematic of a three-pole, encapsulated $SF_6$ switching facility with test setup for vacuum monitoring.

In FIG. 4 is shown a complete switchboard enclosure, which is designated 10. It comprises, in the present invention, three switchgears, each containing three $SF_6$-encapsulated switches. The containers holding the $SF_6$ are marked 11. Disposed in each container is a vacuum switch tube 15, with contact poles 16 and 17 electrically connected to terminals of the switching facility which is not detailed here. The moving contact pole 17 is mechanically connected, via a linkage 18, to a drive system, not shown in FIG. 4, which effects the opening to a drive shaft 12 by connecting elements not shown. Independent of the specified nominal stroke of the contacts, the contact spacing h can be preset at the external drive shaft 12 by means of cam 13 and shock absorber 14, using a manually insertable spacer 19, so as to limit it, for test purposes, to considerably below the nominal stroke, e.g. to 3 mm.

Associated with the vacuum switching tube 15 outside of the container 11 in FIG. 4 is a Geiger-Muller counter 20 which is connected to a measuring instruement 21 coupled to a high-voltage unit 25 via an auxiliary switch. When the auxiliary switch is closed the high-voltage unit 25 is connected to the two contact poles 16 and 17. The method according to the invention can be executed with this arrangement as follows. The invention utilizes the phenomenon that, when the contacts are open and their spacing is small enough or the voltage high enough, electrons are generated between the contacts by field emission, which electrons excite the anode to radiate X-rays.

To test a vacuum switching tube for vacuum, the entire switching facility 10 must be disconnected from the supply mains and both contact poles 16 and 17 must be available for connection to the test instrument. FIG. 4 shows the electrically connections only schematically, in practice the connections being made inside the switchboard. The spacer 19 is inserted between cam 13 and shock absorber 14, acting upon the switching drive 18, thus limiting the switch contact stroke to 3 mm. The high-voltage cable and the ground cable are connected to the two poles of the vacuum switching tube 15. The counting tube of the Geiger-Muller counter 20 is located outside the $SF_6$ tank 11, spaced about 5 cm from the tank wall at the level of the switch contact gap center.

After adjusting the high-voltage to about 57 kV (direct voltage) or 40 kV rms (alternating voltage), and in the presence of vacuum in the switching tube 15, there originate, through field electron emission, X-rays (gamma rays) which must not exceed, outside of the $SF_6$ tank 11, a limit specified in the radiation protection regulations, which is e.g. 1 $\mu$Sv/h. The Geiger-Muller counter 20 furnishes counting pulses per unit of time, i.e., X-ray quanta per second, which are processed in a circuit arrangement and effect the shutoff of the high-voltage unit when reaching a preset threshold. This will be described below in greater detail. But if $SF_6$ has penetrated the vacuum switching tube 15 through a leak, the voltage will not be maintained up to a $SF_6$ pressure, e.g., of about 2 bar. A voltage flashover thus can be sensed because of the lack of X-rays.

By means of the evaluating circuit already described with reference to FIG. 2 it is now possible to detect unequivocally, on the one hand, the presence of operating vacuum in the encapsulated switching tube 15 without impermissibly high X-ray emission occurring. On the other hand, a leak in the switch housing, and in particular $SF_6$ flooding, can be indicated. In FIG. 3, above curve 2 with 1.5 bar $SF_6$ (i.e., 0.5 $SF_6$ overpressure) the test voltage of 0.8 times the normal alternating voltage at 3 mm spacing is no longer maintained and breaks down between the contacts. The signal lamp 35 then lights up after the test period preset by the timer has elapsed, thereby reporting a defective tube, i.e., vacuum loss due to $SF_6$ entry.

By contrast, at a relatively long contact stroke of 10 mm, the voltage would be maintained in both cases, according to FIG. 2. Furthermore, if the vacuum is good, there would be no measurable X-ray emission either. In this case, no distinction could be made between $SF_6$ and vacuum. The overall result is that the contact spacing used for testing at a given alternating test voltage should be between 1 and 8 mm and must be selected as a function of the contact material used in the vacuum switch because the material influences the X-ray emission. (In this context, see the dissertation by D. Dohnal "Investigations on X-Radiation in High-Voltage, High-Vacuum Arrangements" (Technical University Braunschweig 1981)). If, on the other hand, the selected contact spacing h is too small, no differentiation between vacuum and $SF_6$ can be made because, in this case, a lower test voltage would have to be chosen, and the softer X-radiation caused thereby would possibly be absorbed by the switch housing 15 or tank 11.

With a preset voltage of 57 kV DC, comparable to a voltage of about 40 kV AC, rms, i.e., again 0.8 times the alternating test voltage, the voltage is held at 3 mm contact spacing, if the vacuum is good. X-ray emission does then occur, which shuts off the high-voltage unit 25 immediately upon reaching the preset value, due to block 40 of the circuit arrangement of FIG. 2. The signal lamp 48 indicates the presence of vacuum until the high-voltage is reapplied, possibly by the starting button 45 for a second test.

Due to the good insulating properties of $SF_6$ the voltage in the switching tube is possibly also maintained upon reaching a certain $SF_6$ overpressure. In FIG. 3, a curve for, say, 2 bar $SF_6$ would lie between curves 1 and 2. Therefore, even if X-radiation is zero, a distinction can be made between a small leak which has not yet led to complete flooding and complete $SF_6$ flooding in which a test voltage is maintained despite zero X-ray emission.

When executing the method according to the invention it is useful to increase the test voltage from a low value to the operating point with the evaluating circuit being in operation.

It is also possible to use for the evaluating circuit per FIG. 2 a microprocessor in which the functions shown by blocks 30 and 40 and the units 31 to 50 are executed through the software.

What is claimed is:

1. A method of monitoring vacuum in vacuum switches having contacts in a vacuum tube comprising the steps of:

a. setting said contacts at a preselected distance, said preselected distance being shorter than the distance between the contacts in an open position;

b. applying a high voltage to said contacts;

c. monitoring the vacuum tube for X-rays generated by the high voltage between the contacts in the vacuum tube; and d. measuring operating vacuum in said vacuum tube as a function of the X-ray emission.

2. The method according to claim 1, wherein said vacuum tube is insulated by $SF_6$

3. The method according to claim 1, wherein one of said preselected distance and high voltage is set as a function of the contact material of the contacts.

4. The method according to claim 3, wherein said preselected distance is between 1 and 8 mm.

5. The method of claim 4 wherein said spacing is about 3 mm.

6. The method of claim 3, wherein said high voltage is 30 to 100 kV DC at a current of less than 12 mA.

7. The method of claim 6 wherein said high voltage is about 57 KV DC.

8. The method according to claim 3, wherein said high voltage is between 25 and 70 kV AC rms at a current of less than 3 mA.

9. The method of claim 8 wherein said high voltage is about 40 KVAC rms.

10. The method according to claim 3 wherein said high voltage has an initial low value and is increased to maximum value.

11. The method according to claim 1 further comprising the steps of shutting off said high voltage when said X-rays reach a preset threshold, and activating an indicating device for the confirmation of the correct operating vacuu.

12. The method according to claim 11, wherein at zero emission of x-ray radiation, voltage flashover occurs leading to the immediate shutoff of the high voltage, the shutoff activating at the same time as the indicating device to indicate a leak in the vacuum tube.

13. The method according to claim 1, wherein if zero emission of X-radiation is detected the high voltage is applied for a preset test period, e.g., 30 seconds, and thereafter is shut off, the shutoff activating an indicating device to indicate a leak in the vacuum tube.

14. The method according to claim 1 comprising several test cycles for confirmation.

15. Equipment for testing vacuum switches with a vacuum tube and two contacts separated by a preselected distance comprising a high voltage unit for applying a test voltage to the contacts; an X-ray detector; an evaluating circuit for controlling the high voltage unit, and connected to said x-ray detector for determining and indicating an operating vacuum in said vacuum tube, said evaluating circuit being adapted to shut-down said high voltage unit when said x-ray detector detects x-rays in excess of a preselected threshold.

16. The equipment according to claim 15, wherein the X-ray detector is disposed at a preselected distance from said tube, and wherein the X-ray emission for the shutoff of the high-voltage unit is normalized for this distance.

17. The equipment according to claim 16 wherein the preselected distance is 5 cm.

18. The equipment according to claim 15, wherein a spacer is inserted into the drive system for the contact movement of the vacuum switching tube to provide a defined contact spacing below the normal, nominal stroke.

19. The equipment according to claim 15, wherein the evaluating circuit is software controlled by means of a microprocessor.

* * * * *